(12) United States Patent
Cappabianca

(10) Patent No.: US 6,254,708 B1
(45) Date of Patent: Jul. 3, 2001

(54) SHAPED MULTILAYER CERAMIC TRANSDUCERS AND METHOD FOR MAKING THE SAME

(75) Inventor: David P. Cappabianca, Andover, MA (US)

(73) Assignee: Louis J. Desy, Jr., Worcester, MA (US)

( * ) Notice: Subject to any disclaimer, the term of this patent is extended or adjusted under 35 U.S.C. 154(b) by 0 days.

(21) Appl. No.: 09/575,577

(22) Filed: May 22, 2000

Related U.S. Application Data

(62) Division of application No. 09/085,590, filed on May 27, 1998, now Pat. No. 6,097,135.
(60) Provisional application No. 60/048,222, filed on May 30, 1997.

(51) Int. Cl.$^7$ ............... B32B 31/02; B32B 31/26; H01L 41/08
(52) U.S. Cl. ............... 156/89.12; 156/89.14; 156/196; 156/258; 264/633; 310/367
(58) Field of Search ............... 156/89.12, 89.14, 156/89.16, 89.11, 196, 221, 222, 224, 245, 246, 256, 258, 264; 264/633, 642; 310/367, 371

(56) References Cited

U.S. PATENT DOCUMENTS

| | | | |
|---|---|---|---|
| 3,202,736 | * | 8/1965 | Horan et al. . |
| 3,370,187 | | 2/1968 | Straube ............... 310/371 |
| 3,378,704 | | 4/1968 | Miller et al. ............... 310/328 |
| 4,233,477 | | 11/1980 | Rice et al. ............... 179/110 A |
| 4,270,105 | | 5/1981 | Paker et al. ............... 310/313 A |
| 4,276,491 | | 6/1981 | Daniel ............... 310/371 |
| 4,398,325 | | 8/1983 | Piaget et al. ............... 29/25.35 |
| 4,570,098 | | 2/1986 | Tomita et al. ............... 310/346 |
| 4,803,763 | | 2/1989 | Eturo et al. ............... 29/25.35 |
| 4,845,399 | | 7/1989 | Yasuda et al. ............... 310/366 |
| 4,991,151 | | 2/1991 | Dory ............... 367/150 |
| 5,028,473 | | 7/1991 | Vitriol et al. ............... 428/137 |
| 5,050,976 | | 9/1991 | Flint ............... 359/851 |
| 5,153,477 | | 10/1992 | Jomura et al. ............... 310/328 |
| 5,155,709 | | 10/1992 | Flanagan et al. ............... 367/174 |
| 5,160,870 | | 11/1992 | Carson et al. ............... 310/339 |
| 5,164,920 | | 11/1992 | Bast et al. ............... 367/140 |
| 5,176,771 | | 1/1993 | Bravo et al. ............... 156/85 |
| 5,184,330 | | 2/1993 | Adams et al. ............... 367/111 |
| 5,228,011 | | 7/1993 | Owen ............... 367/147 |
| 5,252,883 | | 10/1993 | Kondo ............... 310/328 |
| 5,255,427 | | 10/1993 | Hafner ............... 29/621.1 |
| 5,319,324 | | 6/1994 | Satch et al. ............... 310/315 |
| 5,334,903 | | 8/1994 | Smith ............... 310/358 |
| 5,339,286 | | 8/1994 | Esposto ............... 367/140 |
| 5,340,510 | | 8/1994 | Bowen ............... 264/22 |
| 5,389,851 | | 2/1995 | Kimura et al. ............... 310/340 |
| 5,423,930 | | 6/1995 | Kishishita et al. ............... 156/77 |
| 5,489,353 | | 2/1996 | Brungardt ............... 156/89 |
| 5,507,898 | * | 4/1996 | Aoki et al. . |
| 5,545,461 | | 8/1996 | Takeuchi et al. ............... 428/138 |
| 5,636,051 | | 6/1997 | Lim ............... 310/328 |
| 5,711,833 | * | 1/1998 | Apte et al. . |
| 6,097,135 | * | 8/2000 | Cappabianca . |

\* cited by examiner

*Primary Examiner*—Curtis Mayes
(74) *Attorney, Agent, or Firm*—Weingarten, Schurgin, Gagnebin & Hayes LLP

(57) ABSTRACT

A shape formed multi-laminate transducer which conforms to nonlinear dependent shaped geometries and the shape forming process for producing the nonlinear dependent shaped multilaminate transducer is presented. The shape forming process includes the cutting of the tape cast material to a predetermined two-dimensional shape and then pressing the cut material to form the desired three-dimensional non-linear dependent shape. After shape forming, the sample is sintered, metalized, poled, and made into an acoustical device such as a transducer. The production of such a device by using tape cast material allows designers to easily vary the shape of the product as well as to be able to vary the properties within simply by exploiting the lamination method associated with tape casting. As such, a designer is able to design and manufacture a transducer optimized to meet the requirements of a particular application.

9 Claims, 6 Drawing Sheets

SHAPED MULTILAYER CERAMIC TRANSDUCERS AND METHOD FOR MAKING THE SAME

CROSS REFERENCE TO RELATED APPLICATIONS

The application is a divisional patent application and claims priority under 35 U.S.C. §120 to patent application Ser. No. 09/085,590 filed May 27, 1998 entitled: SHAPED MULTILAYER CERAMIC TRANSDUCERS AND METHOD FOR MAKING THE SAME, now U.S. Pat. No. 6,097,135, which claims benefit of Ser. No. 60/048,222 filed May 30,1997.

BACKGROUND OF THE INVENTION

Piezoelectric ceramic/polymer composites are combined within a polymer matrix to produce a flat tape cast sheet of ceramic material. The flat tape cast sheets can be shaped to form a cylinder, cone or other linear dependent shape for providing a shaped transducer from the flat tape cast sheet. The resulting transducer is limited to shapes which must be linearly dependent. The fabrication methods of the piezoelectric ceramic used in making these composites do not conform to nonlinear dependent geometries. It would be desirable to provide a shape forming process that allows multi-laminates of flat tape cast materials which conform to nonlinear dependent geometries such as hemispheres and to produce a multi-laminate nonlinear dependent shape formed transducer using this process. With such a process the shape of the transducer can be optimized in accordance with a particular application.

BRIEF SUMMARY OF THE INVENTION

A shape formed multi-laminate transducer which conforms to nonlinear dependent shaped geometries and the shape forming process for producing the nonlinear dependent shaped multilaminate transducer is presented. The shape forming process includes the cutting of the tape cast material to a predetermined two-dimensional shape and then pressing the cut material to form the desired three-dimensional nonlinear dependent shape. After shape forming, the sample is sintered, metalized, poled, and made into an acoustical device such as a transducer. The production of such a device by using tape cast material allows designers to easily vary the shape of the product as well as to be able to vary the properties within simply by exploiting the lamination method associated with tape casting. As such, a designer is able to design and manufacture a transducer optimized to meet the requirements of a particular application.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
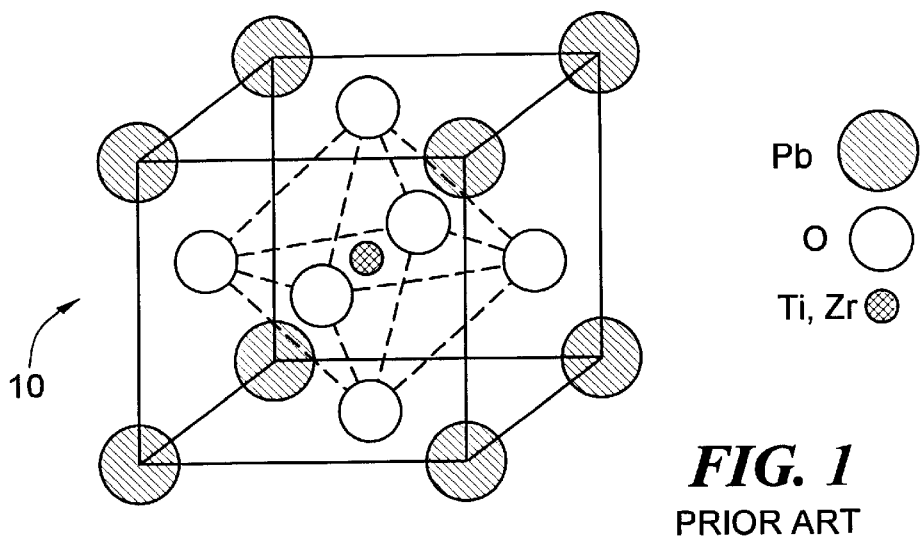
FIG. 1 is a diagram of a Perovskite structure.

Tape casting is a manufacturing process that produces thin, flat, polymer-loaded ceramics that are commonly referred to as tapes. These tapes are stacked together to form laminates which are sintered to make substrates. The substrates are commonly found in the making of multi-layered capacitors and as ceramic packages for integrated circuits. To insure the final substrate produced by tape casting is flat depends on major and minor operations and their respective parameters. These major operations include formulation of a slurry, tape casting, and sintering. Some minor operations include milling the slurry, cutting the tape, and laminating the tape before sintering. There are additional operations needed to make piezoelectric devices out of tape cast material, i.e., metalization and poling.

A shape forming operation can be added to conform the flat tape cast material into nonlinear dependent shapes. A particular example requires shaping the flat tape cast material into a hemispherical dome and utilization of the dome thus formed as an acoustical device such as a transducer. When a flat sheet is formed into a hemisphere wrinkles arise due to the geometric constraints.

Many types of ceramics have been tape cast including alumina, aluminum nitride, barium titanate, and lead zirconate titanate (PZT). PZT is a piezoelectric ceramic that is often found in transducer applications. Tape cast PZT can be found in polymer-matrix composites to make high-frequency phased linear arrays that are used in the medical ultrasound field.

One field of study that will benefit from piezoelectric ceramics conforming to nonlinear dependent geometries is in the development of electroacoustic transducers. The nonlinear dependent shape gives an added mechanical advantage in the piezoelectric device to produce a pressure wave and to provide sound. An optimal geometry can be determined for a desired output. This ability to shape form transducers allows designers to specify the optimal transducer properties for any given system and gives them a means of producing the optimized transducer.

The first step in producing a nonlinear dependent laminated device requires tape casting of the ceramic material. Tape casting is a wet powder forming process that produces a thin polymer-loaded ceramic sheet. These sheets are flexible and are referred to as tapes. The basic process starts by preparing a slurry. A simple slurry consists of a solvent, binder, plasticizer and ceramic powders. The slurry is then cast beneath a "doctor" or scraping blade. The doctor blade sets the thicknesses of the wet tape. The tape dries as the solvent exits from the wet tape. As the wet tape dries it will typically shrink 50 percent in thickness. Typical thickness for dried green tape range from 18 μm to 3 mm. Dried tapes can be cut or punched into two dimensional flat shapes, and then stacked, and laminated before firing.

Tape casting is widely used in the multilayered ceramic packages and multilayered capacitor industries. Other electronic components such as thermistors, ferrites, inductors, and piezoelectrics can also be made from the tape casting process. A major limiting factor of tape casting is the time required to dry the tape. The surface texture of the tape directly relates to the drying rates. This can cause drying chamber to be as long as 35 meters depending on the drying rate. Most industrial processes use a continuous tape casting technique, while others use a batch casting variation The continuous tape caster can produce an "unlimited" length of tape, which can be cut or rolled for later use if desired. The batch tape caster only produce a maximum length of tape due to its size constraints. The typical main components of a production casting machine are a slurry reservoir, a doctor blade apparatus, a tape transport and carrier system. To ensure proper uniform thickness one must control the slurry viscosity, carrier speed, doctor blade gap, and slurry reservoir height A slurry consists of solid ceramic particles that are dispersed in a viscous liquid vehicle. Before slurry preparation can begin, it is necessary to characterize the starting powders. The size and shape of particles or agglomeration, and the distribution of the powder are important to the green (unsintered) density of the tape. The green density has a direct effect on the final sintered density and microstructure. A large distribution in particle size will generally exhibit better particle packing and will achieve fluidity with less solvent than with a narrow particle distribution. A narrow particle distribution, if well-dispersed, will achieve a uniform and dense green tape that will have reproducible shrinkage and uniform microstructure after sintering. Once the starting powders have been characterized, the slurry formulation can begin. The main ingredient in the slurry is the solvent. The main function of the solvent is to dissolve other organics and to distribute them uniformly in the slurry. Solvents are typically organic non-aqueous liquids which have a low boiling point and a high vapor pressure. An example of some traditional solvents that are used in tape casting slurries are methylethylene ketone, cyclohexanone, and toluene. These solvents are easier to evaporate than water, which decreases drying times, and lowers the amount of heat needed to dry the tape. Today, many tape casting slurry systems are changing to more environmentally friendly solvents, such as alcohol and aqueous-based solvents.

Binder is added to the slurry to give strength and toughness to the green tape. When the solvent is removed during drying, the binder-coated particles bond together and form a network of organic interparticle bridges. The binder content should be kept as low as possible in the slurry to maximize the green density of the tape but high enough to maintain its strength during secondary operations. Typical binders have a low glass transition temperature, high molecular weight, and leave little or no carbon based residue in the sample during burnout. Two of the most common organic binders found in tape casting are polyvinyl butyryl and polyvinyl alcohol, while other binders such as gums, starches, waxes, and more recently latex are being used.

Plasticizers are added to the slurry to increase flexibility in the green tape. The increase in flexibility comes from lowering the glass transition point of the binder to a temperature equal to or less than room temperature. Common plasticizers are ethylene glycol, polyethylene glycol, dimethyl phthalate, benzyl butyl phthalate, and dibutyl phthalate.

Deflocculants are added to the slurry as a wetting agent and to help separate agglomerates. A good deflocculant coats the particles (even in the agglomerates) to balance the attractive and repulsive forces of the particles. Balancing these forces keeps the particles in a stable suspension. The deflocculant should be added to the slurry prior to the binders and plasticizers. This prevents competition for particle surface area and introduces a milling operating (solvent, deflocculant, and ceramic powder) to allow the deflocculant time to coat the particle surface and break up agglomerates. This deflocculating milling step also produces a uniform viscosity throughout the slurry and improves particle packing in the green tape.

Once the binders and plasticizers are added to the slurry, another milling operation is undergone to uniformly distribute the remaining organics. A deairing step is introduced to remove air and bubbles in the slurry. A viscosity measurement is then taken on the slip, to ensure proper rheology before the slurry is ready to cast.

Thickness control and surface finish on the green tape are the two major functional requirements in tape casting. There are four operating parameters of major importance in slurries, namely: slurry viscosity, casting speed, slurry reservoir height and doctor blade height. Typical slurry viscosity for tape casting ranges from 500 to 5000 centipoise. The casting speed tends to vary greatly from 5 to 100 cm/min. The height of slurry in the reservoir produces a pressure on the entrance to the channel beneath the doctor blade. This force decreases as the slurry height decreases. For this reason many continuous tape casting operations maintain a constant slurry height (head pressure) in the reservoir. Since most wet tapes shrink in thickness approximately 50%, the doctor blade height is set to twice the desired thickness. Once the percent shrinkage of a particular slurry system is known, the doctor blade height can be set to achieve higher tolerances.

The tape is dried by the evaporation of the solvents used in the slurry. The evaporation rate is typically regulated by controlling the heating or air flow over the tape. The surface texture of a tape cast material directly relates to the drying rate. If the top surface dries too quickly, a skin may form over the tape resulting in defects. Some of the defects that arise by improper drying include bubbles in the tape, tape distortion, and tape cracking. By controlling the partial pressure of the solvent in the air, it is possible to control the rate of solvent evaporation in the wet tape. Relative humidity in the tape casting process typically ranges from 40 to 65 percent. When the tape is cast on a flexible carrier like mylar, the drying stresses and the shrinkage regularly curl the mylar without effecting the thickness of the tape.

The continuous tape caster's air flow normally starts at the exit of the drying chamber and flows in the opposite direction of the moving tape. The air current pushes the solvents that are airborne (via evaporation) over the length of the tape. This causes a gradient in the amount of solvent in the air. The air closest to the exit has the least solvent and the air in the beginning of the drying chamber has the most solvent. This gradient of the solvent in the air controls the rate of evaporation by controlling the partial pressure of solvent over the tape and preventing the tape from drying too quickly.

After the slurry has been tape cast and dried it is now referred to as being green. The green tape is an organic matrix of binder, plasticizer and other processing aids that is loaded with a ceramic. The green tape is strong and flexible enough to be transported from the carrier and handled during the cutting and lamination operations. After the green tape has been cut and/or laminated, it is placed in a furnace to remove the organics. Once the organics are removed, the tape is no longer referred to as green.

Advantageously, the tape cast material is piezoelectric. Piezoelectricity is the ability of certain crystalline materials to develop an electrical charge proportional to a mechanical stress. The converse of this is also true. If voltage is applied across the crystalline material, it will show a mechanical strain.

Piezoelectricity is the result of a non-symmetrical crystal structure. The most important crystal structure in studying piezoelectricity is the Perovskite structure. Some common piezoelectric materials that are used today include quartz single crystals, barium titanate and lead zirconate titanate (PZT) families of polycrystalline ceramics, along with a semicrystalline polymer called polyvinylidene fluoride (PVDF). These types of materials are the foundation of electromechanical transducers that are used today.

Typical applications for these materials are found in actuators, resonators, ultrasonic emitters and transducers (which are found in the medical imaging and non-destructive testing fields), sound projectors, phonograph pick-ups (needles), wave filters and guides, and spark igniters.

Referring to FIG. 1, the Perovskite structure 10 is shown. The structure comprises a simple cubic unit cell that has large cations on the corners, oxygen ions on the face centered sites, and a small cation located at the body centered site. Each $Pb^{2+}$ ion is surrounded by 12 oxygen ions and fills the dodecahedral holes. The large $Pb^{2+}$ ions stretch the crystal structure. All the oxygen ions in the structure form a network of oxygen octrahedra. The smaller cation can be either a $Zr^{4+}$ or $Ti^{4+}$ ion that is surrounded by 6 oxygen ions, where the small cation fills the octahedral hole. The small cation is in a metastable position due to the size of the unit cell. The small cation seeks a minimum energy position near one of the oxygen ions in the octahedral oxygen cage. By doing this, the $Zr^{4+}$ or $Ti^{4+}$ ion is not located in the ideal center of the unit cell and the unit cell is unsymmetrical. This unsymmetrical unit cell along with the high charge number on the ion yields an electrical dipole and will be piezoelectric.

The dipole causes one side of the unit cell to have a positive charge while the opposite side will have a negative charge. In a network of unit cells, the dipole will result from the difference of the average location of all the positive and negative charges. Areas within a given crystal with like charge are called domains (dipoles in the same direction). Domains tend to form after the crystal is cooled through its Curie temperature. To minimize the free energy in the crystal, the domains try to align themselves to have a total net charge of zero.

When the crystal is placed in a DC field, the domains are oriented in the direction of the field. This is called poling. If the applied voltage is strong enough, all the dipoles of the crystal will become parallel, the domain walls will disappear, and a single domain crystal results. In multi-crystalline ceramics that have randomly orientated crystals it is not possible to achieve 100% of the single crystal value. The small ionic movement during polarization occurs in specific crystallographic directions and the more possible directions that the crystals have the closer they can be brought to the direction of the poling field. The polarizing field can vary in strength. Typical fields range from 10 to 20 kV/cm. Increasing the DC field used in poling has a direct effect on the number of electrical microcracks found in piezoelectric ceramics after poling. These microcracks have a direct effect on the fatigue life of the piezoelectric ceramic. There is a slow rearrangement of the domains after poling. This aging effect is very small and implies that ceramics have good time stability after poling.

There are two simple types of piezoelectric effects, the direct effect and the indirect effect. The direct effect occurs when an external mechanical pressure is applied to the piezoelectric material and a resulting voltage is generated. The external pressures can include vibrations and dynamic loads. Some materials also respond to thermal changes and these materials are called pyroelectrics. The indirect effect occurs when an electric field is applied to a piezoelectric resulting in the material's structure changing shape, producing macroscopic dimensional changes in the material.

Piezoelectric materials have a wide range of applications and, as such, the ideal properties vary from application to application. For any given piezoelectric material, there are characteristic piezoelectric constants for the material in question. These constants are written as tensors that have two subscripts. The first subscript is the electrical directions, while the second is the mechanical directions. For example $d_{33}$ implies a mechanical stress is placed in the z-direction on a piezoelectric material and this value would be a measurement of the electrical effect also in the z-direction. Mechanical shear is given the subscripts 4, 5, and 6 to their respective x, y, and z-directions. A high d value is desirable for the piezoelectric material to develop motion or vibration. This value (d) is called the piezoelectric constant and equals D/T and S/E, where D is the dielectric loss, T is a stress, S is the strain, and E is the field and has units of meter/volt. Another important constant is the g constant. This value (g) is the field produced by a given stress and has the units of volt*meter/newton. The constants d and g are related by the material's dielectric constant (K)

$$d = gK\epsilon_o,$$

where $\epsilon_o$ is the permittivity of free space.

One of the most important values for measuring strength of an electromechanical transducer is the electromechanical coupling coefficient (k) where, $$k^2 = \frac{\text{electrical energy converted into mechanical energy}}{\text{input electrical energy}} \quad 1$$

or $$k^2 = \frac{\text{mechanical energy converted into electrical energy}}{\text{input mechanical energy}} \quad 2$$

Typical values of k are 0.1 for quartz, 0.4 for barium titanate, and 0.5–0.7 for PZT. The high electromechanical coupling coefficient of PZT makes it a good material to use for pulse-echo operations. PZT is the most widely used piezoelectric ceramic. Many of the piezoelectric properties can be modified by additions and substitutions of ions to this perovskite structure 10, which has lead to the creation of a whole family of PZT ceramics. Two of the major producers of PZT-family powders are EDO located in Salt Lake City, Utah and Morgan Matroc located in the United Kingdom. PZT is a solid solution of $PbZrO_3$ and $PbTiO_3$. A paraelectric (P)-ferroelectric (F) transition occurs as the PZT sample is heated above a phase boundary and the material becomes non-polar and acquires a center of symmetry transforming from rhombohedral (R) or tetragonal (T) to cubic (c). This temperature is known as the Curie Temperature for any composition. There also exists a morphotropic phase boundary (MPB) between 45–50 mole % $PbTiO_3$.

PZT shows its strongest piezoelectric effect near this morphotropic phase boundary. The morphotropic phase boundary is a compositional phase boundary where the two adjacent phases have equal Gibbs free energies. To the left of this morphotropic phase boundary exists a rhombohedral phase ($F_R$). To the right exists a tetragonal phase ($F_T$). For this reason the morphotropic phase boundary is typically located between 45–50 mole % $PbTiO_3$ and explains why data obtained by different processing techniques on the width of this boundary are quite different.

For this embodiment a particular PZT material was used. A dispersant test was conducted to determine the best suitable dispersant that would suspend the PZT powder in a 1-propanol solvent. Five grams of PZT powder and four drops of dispersant were shaken in a test tube containing 25 ml of solvent. Fifteen samples containing different dispersants from Micromeritics Corporation and Witco Corporation were shaken for the same length of time. After 3½ hours a visual inspection was performed to determinate the best suitable dispersant based on the suspension (lack of settling) of the powder in the solvent/dispersant system. The Sedisperse P-11 worked the best with the 1-propanol solvent. The selection of a binder was based on tests done with a poly(n-butyl methacrylate/iso-butyl methacrylate), a polyvinyl butral resin was chosen along with a butyl benzyl phthalate as a plasticizer.

Three variations of the slurry recipe were used in this embodiment. The difference in the slurries are in the binder/plasticizer weight ratio. A first tape has a ratio of 2.5, a second tape has a ratio of 0.5, and a third tape has a ratio of 1.0.

All of the organic material added during processing must be removed before the sintering of PZT can begin. These organics undergo a burn out cycle at a high enough temperature to ensure 100% volatilization. A slow ramp rate is needed to reach this burn out temperature to ensure time for each of the organic components (binder, plasticizer, etc.) to leave the sample. If burn out happens too quickly the sample can crack as the gases exit the sample and the organics can leave a carbon based residue behind.

Sintering of PZT needs to be carefully controlled. The Pb in the sample that is being sintered in air, wants to oxidize, and turn into PbO. Therefore a controlled atmosphere is needed. A simple and common way to control this effect is to put lead zirconate powder in the sealed sintering chamber to maintain an adequate PbO activity in the atmosphere surrounding the sample. Maintaining an adequate PbO partial pressure in the furnace atmosphere minimizes the Pb lost in the sample. The amount of lead zirconate powder that is required depends on the volume of the chamber and the volume of the sample. The sample should be weighed after the burn out cycle and after sintering to determine the amount of Pb lost. Then the amount of lead zirconate powder can be adjusted in the chamber to minimize Pb lost in the next batch of samples. There is normally a loss of 2%–3% PbO in the starting material after sintering.

Ideally, solid-state sintering is desired where the only mode of densification is by solid diffusion. Sintering temperatures typically range from 1200° C. to 1325° C. At these temperatures, PZT needs only to be held for short times (between 30 minutes and one hour), to achieve a closed porosity state that is equal to approximately 95% of theoretical density. Additional time at the sintering temperature will allow any remaining trapped gases to diffuse out along the grain boundaries and increase densification. However, if the sample remains at the sintering temperature too long abnormal grain growth can occur. Abnormal grain growth is when the large grains continue to grow at the expense of small ones, and also causes an increase in the average pore size that affects the dielectric properties in the sample.

The average grain size in PZT plays an important role in both the mechanical and electrical properties. Adequate grain growth will maximize the electromechanical coupling factor and minimize both dielectric and mechanical losses. The electromechanical coupling factor approaches a maximizing limit above 5 $\mu$m. This is most desirable when the piezoelectric material will be used in a pulse-echo operation. The smaller grain sizes improve the flexural strength of the samples but reduce the piezoelectric properties. Typical PZT grain size ranges from 2 to 8 $\mu$m and studies have been done of grain sizes from 1 to 12 $\mu$pm. The end uses of the PZT dictate the suitable range of grain sizes needed for its particular application.

The tape casting process produces thin flat sheets. These sheets can be laminated together to create multilayered composites. The organics in the tape dictate the type of lamination the sheets will need to undergo in order to adhere to one another. Depending on the binder/plasticizer ratio the tape can stick to itself without any additional heat or solvent. This is known as cold (dry) lamination. Hot lamination uses heat to adhere one sheet to another, while wet lamination uses a small amount of solvent on the bonding surfaces of the sheets to adhere them together. These laminated sheets are then ready to be cut into any two-dimensional shape. In a particular example three tapes were cast. Each tape varied in thickness and binder/plasticizer ratio. After the slurry was cast the wet tape was dried on the drying table. The drying table was held at approximately 35° C. for 4 hours. After the tape has dried it was removed from the mylar carrier or rolled onto the take-up reel and saved until it is needed. If the organics in the tape system are of the correct proportions the tape can be peeled from the mylar carrier without any flaws being introduced into the tape, i.e. cracking. The final dried tape thickness for the first tape was 90 $\mu$m, for the second tape the dried thickness was 25 $\mu$m, and for the third tape the dried thickness was 340 $\mu$m.

Linear dependent three dimensional shapes are produced by cutting the correct two dimensional shape out of the tape cast sheet. For example, a two dimensional flat sheet can be curved along one axis to produce a cylinder. Another simple example is to make a cone from a two dimensional sheet. The cylinder and cone can be made from these two dimensional shapes because the three dimensional shapes are linearly dependent. If a three dimensional object can be traced with a single line moving through three dimensional space, it is said to be linearly dependent. For example, the path of a single line that circles around a fixed axis at a given radius will produce a cylinder. Likewise, the path of a single line fixed at one end and its other end circles around a fixed axis at a given radius will produce a cone. Complex shapes such as a hemisphere can not be produced by this method. The hemisphere is not a linear dependent shape since only two points in the hemisphere lie on any given line. Therefore, as long as there is line continuity in a three dimensional shape, this shape is able to be produced from a two dimensional shape. Wrinkles arise in the three dimensional shape when a two dimensional shape is forced into a non-linear dependent three dimensional shape. This nonconformity of shape must be accounted for when designing the final three dimensional shape to avoid wrinkles.

Figure 2A:
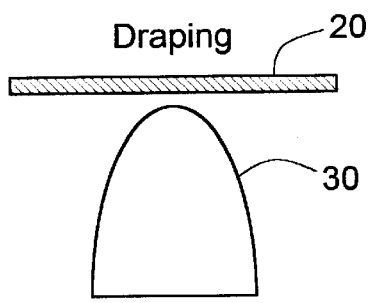
FIG. 2A is a diagram of a draping shape former.
Figure 2B:
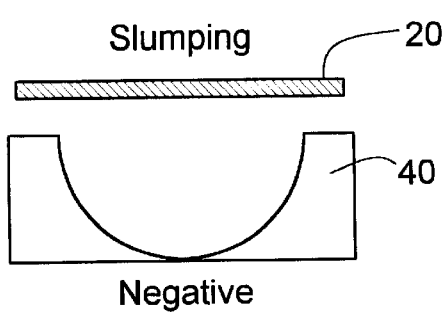
FIG. 2B is a diagram of a slumping shape former.
Figure 2C:
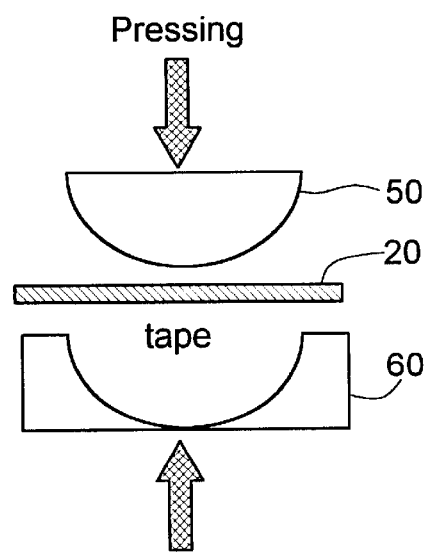
FIG. 2C is a diagram of a pressing shape former.

Three shape forming techniques—draping, slumping and pressing—can be used to form the shaped device and are shown in FIGS. 2A–2C. Referring to FIG. 2A, the draping technique uses a positive mold 30 of the shape being produced. The tape cast sheet 20 is then placed on top of the positive mold 30. The tape cast laminated sheets 20 are heated to their glass transition temperature where the tape 20 conforms to the mold 30. The slumping technique shown in FIG. 2B uses a negative mold 40 and when the tape cast laminated sheets 20 are heated above their glass transition temperature, the material 20 flows into the mold 40 under its own weight. There will be many practical cases where a complex mold will simultaneously use both the draping and slumping techniques. The pressing technique shown in FIG. 2C uses a male mold 50 and a female mold 60 and adds an external force to assist the laminated sheets 20 to conform to the desired shape. Pressing may be done at room temperature (cold pressing) or at increased temperature (warm pressing).

The three shape forming techniques (draping, slumping and pressing) were tested on tape cast laminates ranging from 2 to 8 layers. The goal of these tests was to study the ability of the material to conform to a non-linear dependent shape. A dome/hemisphere structure was chosen as the non-linear dependent shape. A positive aluminum mold was used in the draping test, while a negative aluminum mold was used for the slumping test. Both the draping and slumping tests were conducted simultaneously at various temperature ranges and for various lengths of time.

A pressing die was made using a one inch diameter steel hemisphere as the male mold and a one inch diameter negative hemisphere was milled out of a steel block to a depth of half an inch for the female mold. The mold design was simple and did not account for producing a sample with a uniform thickness. Boron Nitride and Silicone were used as mold release agents for the pressing operation.

The dried tape had different lamination qualities depending on its binder/plasticizer ratio. The first tape needed to be warm pressed at a pressure higher than 2000 psi to ensure no delamination took place after lamination. The second tape had the highest amount of plasticizer and had very good cold lamination properties. The third tape needed to be cold pressed to a minimum of 200 psi and was very easy to work with. Laminates from the third tape did not stick to each other without this added pressure. This made it easy to align the tape together before pressing. Two flat plate samples were formed by pressing laminates of PZT tape together.

The goal of shape forming tape cast laminates by the draping, slumping, and pressing techniques is to study the ability of the tapes to conform to non-linear shapes. The draping and slumping tests were conducted at various temperatures ranging from room temperature to 200° C. and various times from a few minutes up to two weeks. In both the draping and slumping tests there was minimal conformity of the green tape to the shape of the mold. The draping samples had many wrinkles, while the slumping samples failed to slump into the negative mold. This problem (failing to slump) might be attributed to the binder/plasticizer ratio and the amount of organics to solids ratio. A higher organics ratio would increase the degree of slumping. It was noted that at elevated temperatures the tape became brittle as the length of time was increased. The brittleness in the tape was due to the leaching of the plasticizer in the green tape to the atmosphere.

The pressing technique produced a green laminated hemispherical dome that had many wrinkles. However, there was enough lamination strength and plastic deformation that the sample held its shape after pressing. Attempts were made to try and force the material to flow evenly in the pressing die. Even at higher pressing pressures (above 10,000 psi) there was not enough plastic deformation in the tape cast laminate to remove the wrinkles. There was simply too much material in the pressing die to rearrange at this organic to solids ratio. Too much material rearrangement will cause inconsistencies in the laminated cross section of the sample. Therefore to remove the wrinkles in the pressed samples the amount of "extra" material in the two dimensional flat laminates must be removed. As stated before, a two-dimensional shape will not conform to a three dimensional non-linear shape; to make this happen the material's deformation properties must be exploited. This is based on the organic to solid ratio in the tape. To minimize the material deformation in the laminate the "extra" material was removed evenly throughout the laminated surface.

Figure 3:
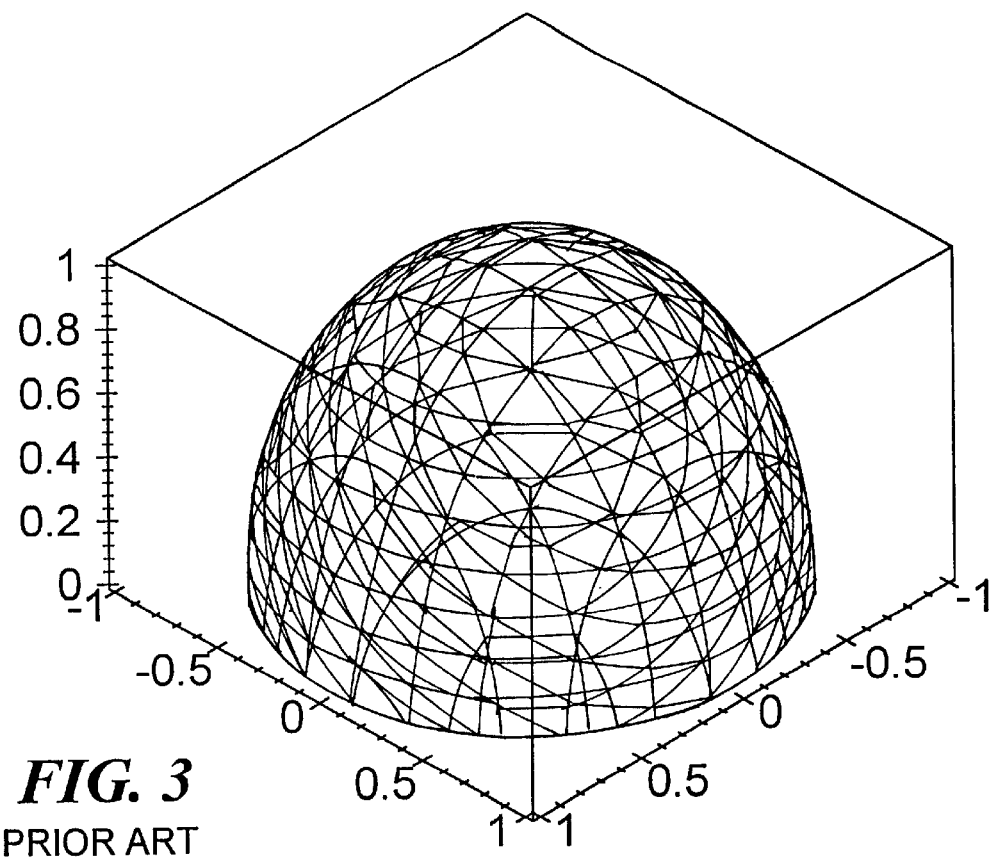
FIG. 3 is a diagram of a three dimensional model of a hemisphere.

To improve on the pressing technique and form a wrinkle-free net shape sample the following rationale was developed. Referring to FIG. 3, the circumference of the base of the hemisphere having a 0.5 inch radius is 3.14 inches. The arc length from the base of the hemisphere having a 0.5 inch radius passing through the apex and ending at the opposite side of the base of the hemisphere is 1.57 inches. The surface area in the hemisphere having a 0.5 inch radius is 1.57 inches$^2$.

A laminate (circle) having a 1.57 inch diameter is needed to maintain the continuity of the arc length in the hemisphere having a 0.5 inch radius. The surface area in a laminate having a 1.57 inch diameter is 1.94 inches. There is approximately 23.5% more material ("extra" material) in the surface area of the laminate (circle) than in the hemisphere. The outer perimeter of the laminate needs to conform to the circumference of the base of the hemisphere. Since the circumference of the laminate is 4.93 inches, 1.79 inches must be removed from the circumference, to equal the 3.14 inch circumference of the base of the hemisphere.

The next step in determining how to modify a sheet of material such that is shape formed without producing wrinkles was to determine what a hemisphere would look like when projected on a two-dimensional plane. A starting place is to take the arc length from the bottom of the hemisphere to its apex in the x-z plane and transform it to the x-y plane using a parametric equation.

Using a polar coordinate system for the hemisphere the arc length, S, equals the radius, r, multiplied by the angle, Θ, therefore, $$S=r\Theta.$$

To transform the arc to the x-y plane the equation $$x=r\cos\Theta$$

is needed.

Figure 4:
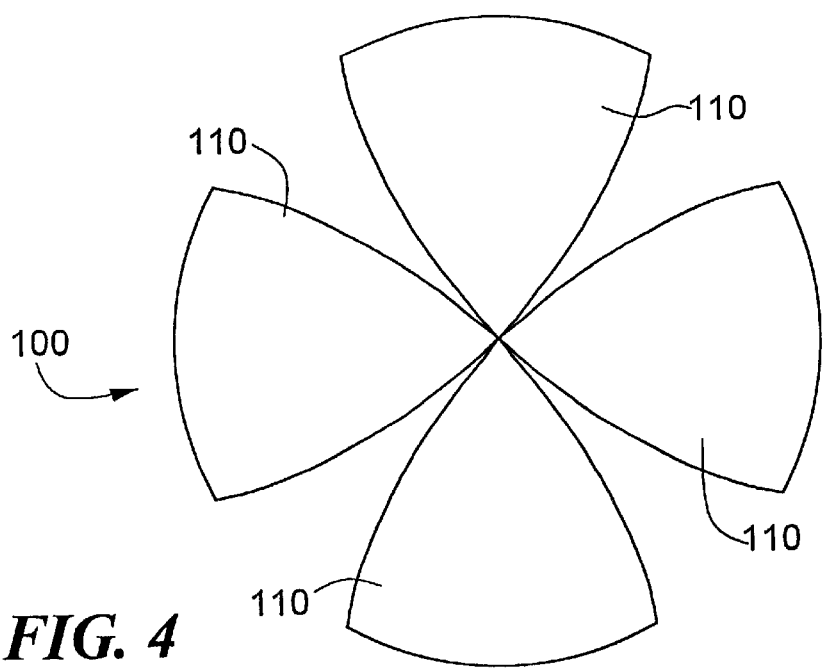
FIG. 4 is a diagram of a two dimensional hemisphere having four petals.
Figure 5:
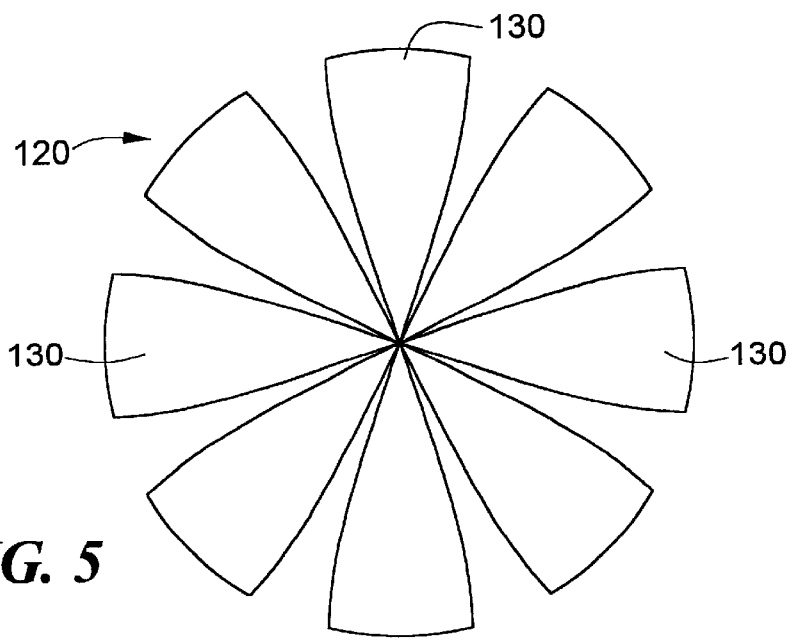
FIG. 5 is a diagram of a two dimensional hemisphere having eight petals.

On the x-axis the arc length distance is plotted versus one half cross sectional distance on the y-axis. This cross sectional distance is the change in the diameter of the hemisphere as the x-y plane travels along the z-axis. If four identical arc lengths are plotted 90° apart, from each other on the hemisphere, along with their respective inversed arc lengths the resulting transformation of a two-dimensional plane appears. Four "perimeter" arcs are added to maintain the circumference around the base of the hemisphere. These "perimeter" arcs were determined from the radius of a circle that connects the eight arc lengths. The result, shown in FIG. 4, is a shape 100 which includes four flower-like petals 110. One two-dimensional petal 110 is a close approximation of a true three-dimensional quarter hemisphere. Although these transformed two-dimensional arcs are directly related to the three-dimensional arcs of the hemisphere an infinite amount are needed to accurately represent the entire surface area of the hemisphere on the two-dimensional plane. Therefore, the more petals into which the two-dimensional laminate is cut, the closer it will be to attaining its true representation of a three-dimensional hemisphere. A version 120 having eight petals 130 is shown in FIG. 5. Also with each additional petal less "extra" material is introduced in the pressing (shape forming) method, which decreases the flaws that arise from the wrinkles.

When this petal technique was utilized immediate improvements were seen in the green sample produced by the pressing technique. The laminates were staggered so that the seams did not align with other seams in the laminates. The extra residual material in this technique flows into the seams during the pressing process and creates a wrinkle free green sample.

Five shaped hemispheres were formed by this method. These hemispherical domes are made from four laminates cut into eight petals from the third tape. The hemispherical domes were pressed to 1000 psi and held their shape after pressing.

Figure 6:
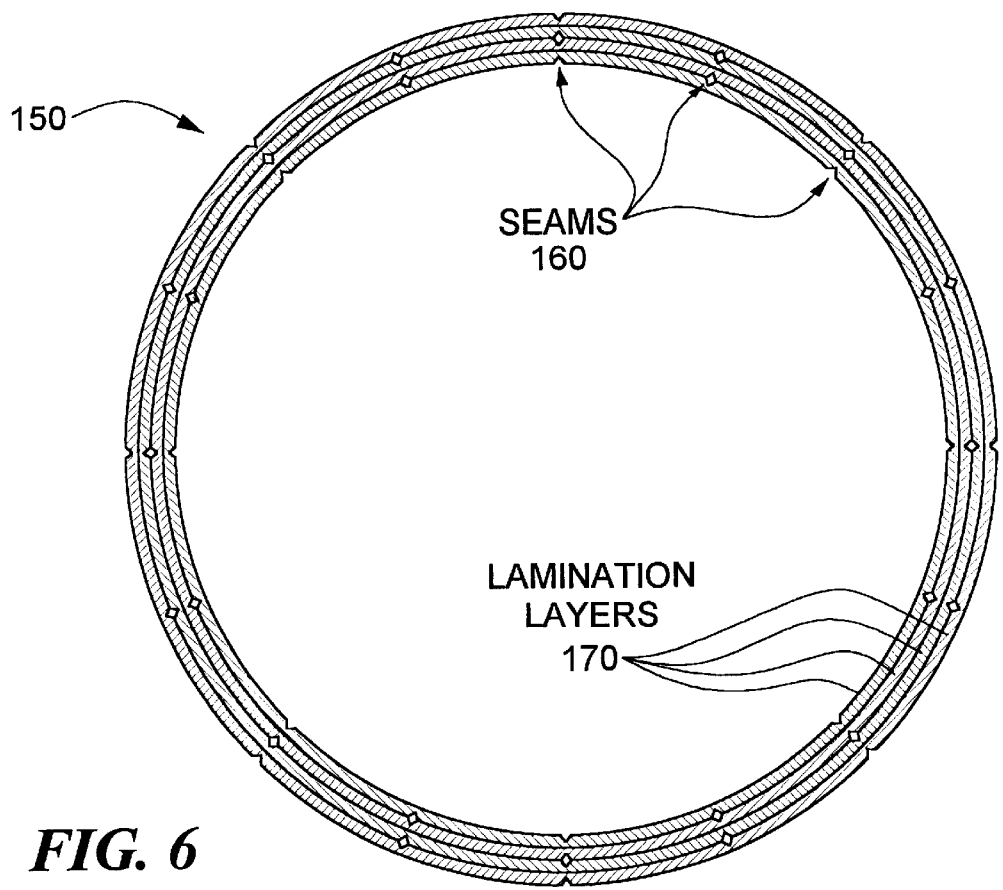
FIG. 6 is a diagram of a cross-section of a laminated shape formed hemisphere.

Referring now to FIG. 6, a cross section of a laminated dome sample 150 having four layers 170 made from the eight petal technique is shown. This figure represents the possible locations where flaws may develop in the cross section during sintering. Flaws are likely to be seen along the petal's seams 160 or between the lamination layers 170.

Figure 7:
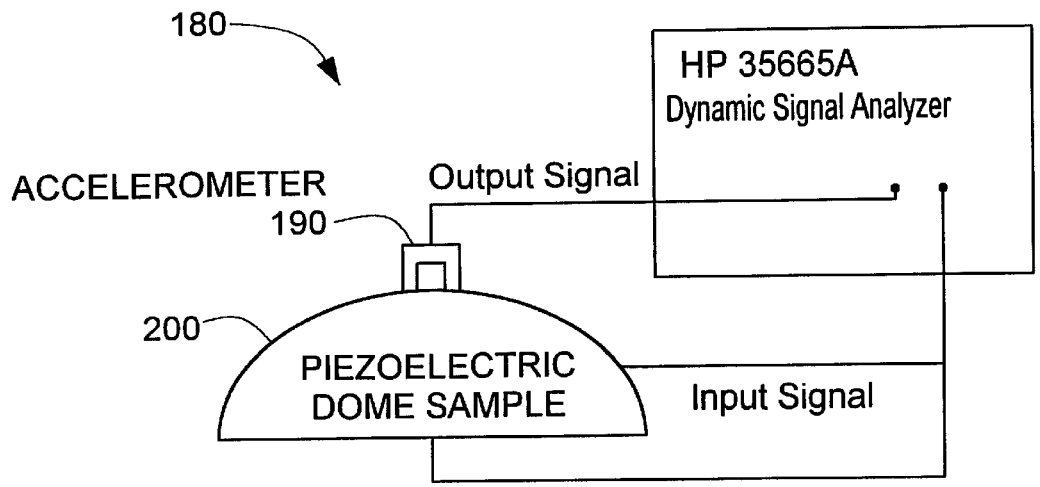
FIG. 7 is a diagram of an accelerometer test setup.
Figure 8:
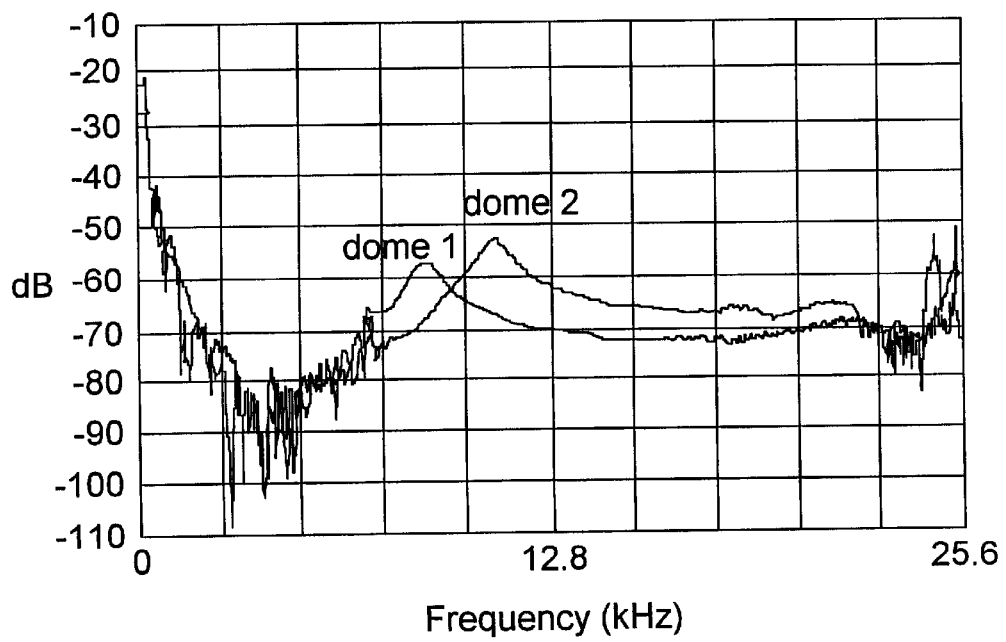
FIG. 8 is a graph of the frequency response for two hemispheres.

After the hemispherical dome samples were sintered and poled the samples were tested to see if they exhibited piezoelectric properties. Several tests were conducted on two hemispherical domes to show their piezoelectric effect and acoustic effect. The first test, using the configuration 180 shown in FIG. 7 used an accelerometer 190 attached to the hemispherical dome 200 to see if 1) the hemispherical dome samples were piezoelectric and 2) there was a difference in their characteristic frequency response. A input signal was applied to the dome sample while the accelerometer output signal was measured. FIG. 8 shows the frequency response plots for two hemispherical domes. One hemispherical dome (1) had a peak at 9 kHz and the other hemispherical dome (2) had its peak at 11 kHz. The accelerometer tests concluded that the hemispherical domes were piezoelectric.

Figure 9:
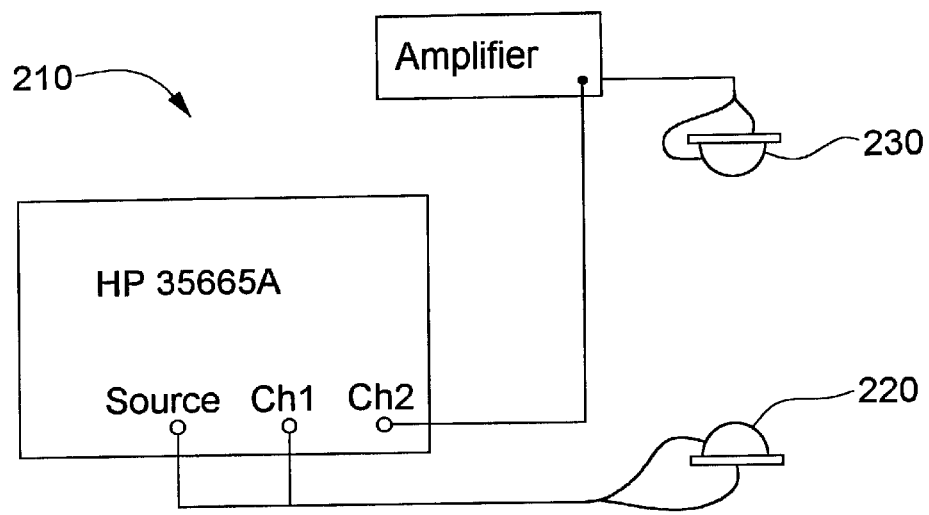
FIG. 9 is a diagram of a hemisphere to hemisphere test setup.

An additional test was performed to further verify the shaped transducer. This test transmitted an acoustical signal with one dome and attempted to receive this signal with a second dome, allowing for one hemispherical dome to "talk" to the other. FIG. 9 shows the setup 210 for the acoustical test. Two tests were conducted using this setup. The bottom hemispherical dome (transmitter) 220 produced the pressure (acoustical) waves and the other hemispherical dome 230 was used as the receiver. The first test had a separation between the domes of 2 cm while the next test had a separation of 36 cm. The frequencies used for both these tests were 0 to 25 kHz and 0 to 51 kHz. The results showed a very flat frequency response over the general range of frequencies. This shows that the two hemispherical domes 220, 230 were indeed "talking". The transmitting hemispherical dome 220 was sending electromagnetic waves along with, if any, acoustical (pressure) waves and these waves (electromagnetic and acoustical) were being received by the other dome 230. No attempt was made to shield the electromagnetic signal from the receiving hemispherical dome. The acoustical test was repeated without the hemispherical domes to see the effect of the electromagnetic signal. This test concluded that the original acoustic test data was due the electromagnetic signal. No acoustic data, if any did exist, was extracted from the original acoustic "talking" test data.

Figure 10:
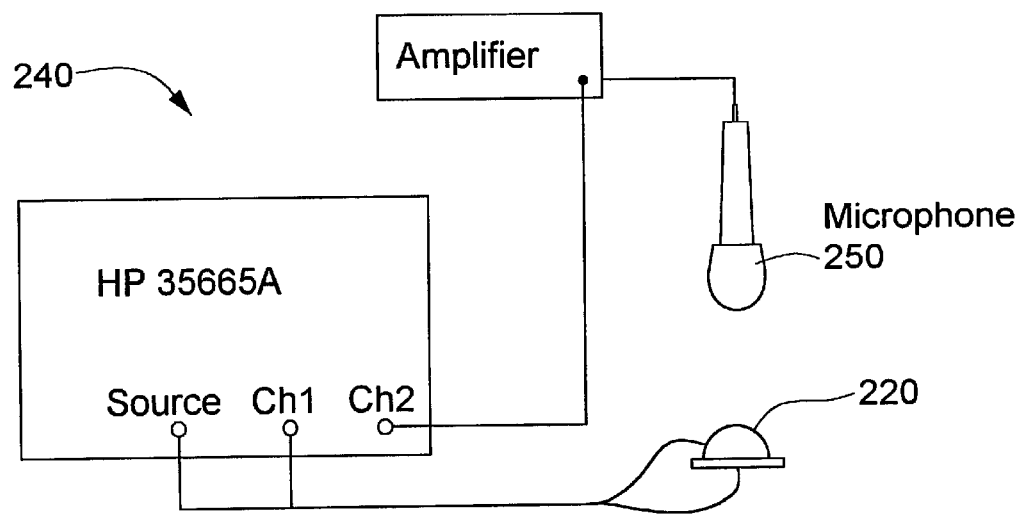
FIG. 10 is a diagram of a hemisphere to microphone test setup.
Figure 11:
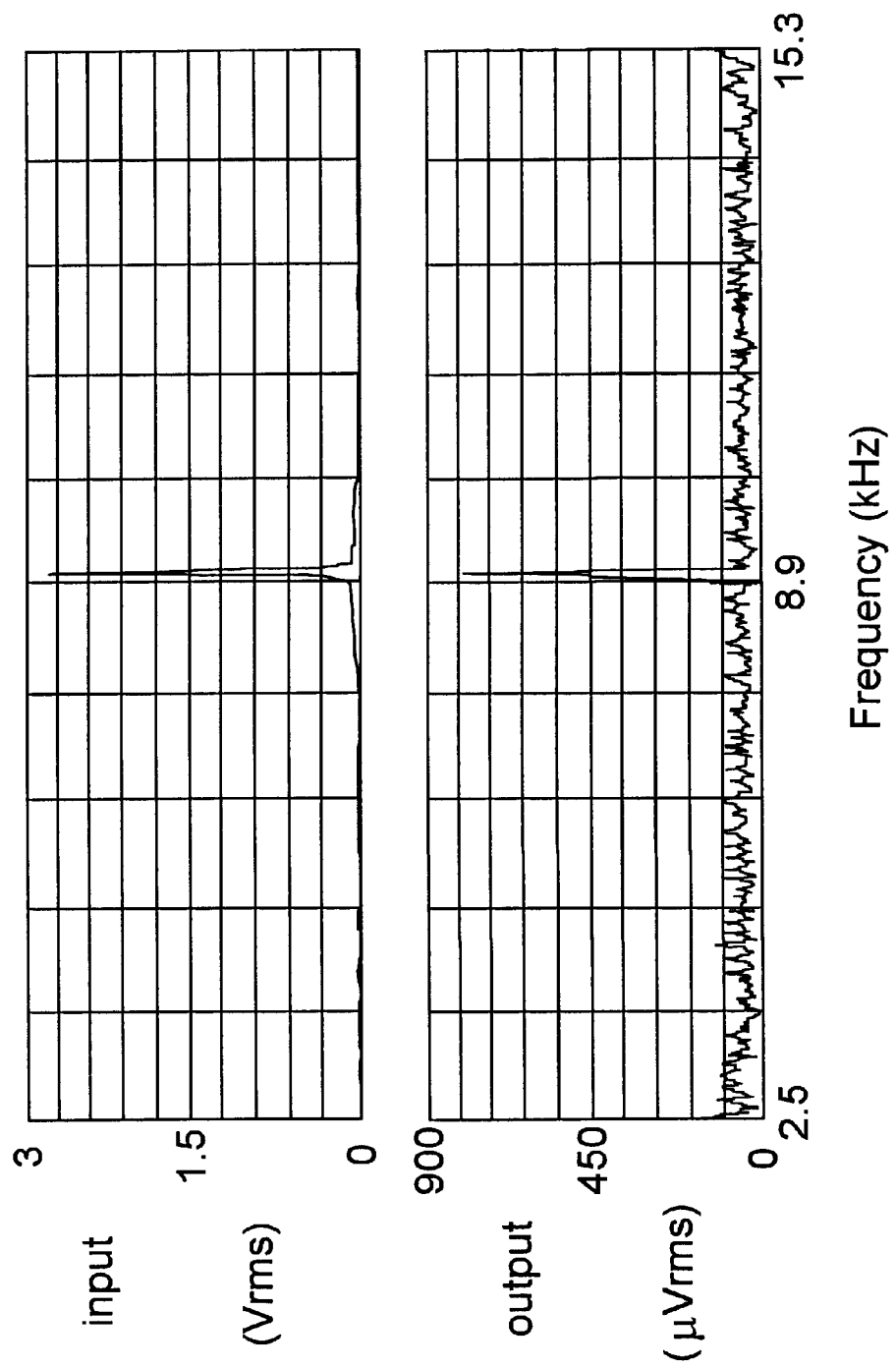
FIG. 11 is a graph of the frequency response of the test setup of FIG. 10.

The next step in creating an acoustical signal was to increase the output power of the transmitting hemispherical dome 220 (at a frequency of 9 kHz). By increasing the transmitting power an audible tone was produced. This simple test showed that acoustical waves were transmitted from the hemispherical dome. The earlier acoustical test experiment (at this increased power level) was repeated in order to have the hemispherical domes "talk" to each other. To accomplish this electromagnetic shielding is needed on the test samples to prevent the electromagnetic signals from interfering with the acoustical data. A similar setup 240 shown in FIG. 10 was utilized. Instead of shielding, a microphone 250 was used to receive the signal being transmitted from a single hemispherical dome 220. The microphone 250 was inherently shielded from any electromagnetic signals being produced from the hemispherical dome test sample. An input signal of 9 kHz was applied to the dome sample 220 and the microphone 250 received a signal of 9 kHz as shown in FIG. 11. Hence the dome sample 220 transmitted the 9 kHz signal that the microphone 250 received. The signal to noise ratio in the received signal was approximately 8.8:1. Accordingly, the above described process produced hemispherical piezoelectric domes which functioned as transducers.

The shape forming process described herein includes the cutting of the tape cast material to a predetermined two-dimensional shape and then pressing the cut material to form the desired three-dimensional green shape. After shape forming, the green transducer samples were then sintered, metalized, poled, and made into an acoustical device. The final acoustical devices were then tested and determined to be functional. The formation of such a device by using tape cast material allows designers to easily vary the shape of their product as well as to be able to vary the properties within simply by exploiting the lamination method associated with tape casting. This ability to shape form transducers allows designers to specify the desired transducer properties for any given system and gives them a means of producing the transducer. Therefore, this process allows the designer to design and manufacture a transducer which is optimized to meet the needs of a particular application.

Having described preferred embodiments of the invention it will now become apparent to those of ordinary skill in the art that other embodiments incorporating these concepts may be used. Accordingly, it is submitted that the invention should not be limited by to the described embodiments but rather should be limited only by the spirit and scope of the appended claims.

I claim:

1. A method of making a shaped multilayer device comprising:

modifying a first layer of tape cast material by removing sections therefrom to form a plurality of petals such that said first layer of tape cast material is formable into a nonlinear dependent shape, wherein said nonlinear dependent shape is capable of being a hemisphere;

forming said first layer of tape cast material into said nonlinear dependent shape by joining together adjacent sides of each of said plurality of petals to form the nonlinear dependent shape, said first layer having a top side and a bottom side opposite said top side;

laminating at least one additional layer of tape cast material onto the top side of said first layer of material to form a laminated device, said at least one additional layer of tape cast material having been formed into a substantially similar shape as said nonlinear dependent shape before said laminating;

sintering said laminated device;

metalizing said laminated device; and poling said laminated device.

2. The method of claim 1 wherein said first layer of tape cast material comprises a piezoelectric material.

3. The method of claim 1 wherein each of said at least one additional layer of tape cast material comprises a piezoelectric material.

4. The method of claim 1 wherein said first layer of tape cast material comprises PZT.

5. The method of claim 1 wherein each of said at least one additional layer of tape cast material comprises a layer of PZT.

6. The method of claim 1 wherein said nonlinear dependent shape comprises a hemisphere.

7. The method of claim 1 wherein said device comprises a transducer.

8. A method of making a shaped multilayer device comprising:

forming a first layer of tape cast material into a nonlinear dependent shape, said first layer having a top side and a bottom side opposite said top side;

modifying each of at least one additional layer of tape cast material by removing sections therefrom to form a plurality of petals such that each of said at least one additional layer of tape cast material is formable into said nonlinear dependent shape, wherein said nonlinear dependent shape is capable of being a hemisphere;

forming said at least one additional layer of tape cast material into a substantially similar shape as said nonlinear dependent shape by joining together adjacent sides of each of said plurality of petals to form said nonlinear dependent shape;

laminating said at least one additional layer of tape cast material onto the top side of said first layer of material to form a laminated device;

sintering said laminated device;

metalizing said laminated device; and poling said laminated device.

9. The method of claim 8 wherein the step of joining of adjacent sides of each of said plurality of petals forms a respective seam, and wherein the step of laminating includes configuring a layer so that seams of any layer are not aligned with seams of an adjacent layer.

* * * * *

UNITED STATES PATENT AND TRADEMARK OFFICE
CERTIFICATE OF CORRECTION

PATENT NO. : 6,254,708 B1
DATED : July 3, 2001
INVENTOR(S) : David P. Cappabianca It is certified that error appears in the above-identified patent and that said Letters Patent is hereby corrected as shown below:

Column 8,
Line 16, "$\mu$pm" should read -- $\mu$m --; and

Column 10,
Line 28, "inches." should read -- inches$^2$. --.

Signed and Sealed this

Twenty-sixth Day of November, 2002

Attest:

JAMES E. ROGAN
Attesting Officer       Director of the United States Patent and Trademark Office